United States Patent [19]

Leonowich

[11] Patent Number: 5,434,525
[45] Date of Patent: Jul. 18, 1995

[54] WIDE-RANGE VARIABLE DELAY AND RING OSCILLATOR

[75] Inventor: Robert H. Leonowich, Muhlenberg Township, Berks County, Pa.

[73] Assignee: AT&T Corp., Murray Hill, N.J.

[21] Appl. No.: 268,156

[22] Filed: Jun. 28, 1994

Related U.S. Application Data

[63] Continuation of Ser. No. 23,243, Feb. 25, 1993, abandoned.

[51] Int. Cl.⁶ ............................. F03K 5/14; H03B 5/20
[52] U.S. Cl. ..................................... 327/278; 327/395; 327/396; 331/57
[58] Field of Search ............... 307/603, 597, 595, 602, 307/605, 542, 443, 290; 377/72; 331/57

[56] References Cited

U.S. PATENT DOCUMENTS

| | | | |
|---|---|---|---|
| 4,571,504 | 2/1986 | Iwamoto et al. | 307/290 |
| 4,603,264 | 7/1986 | Nakano | 307/290 |
| 4,611,135 | 9/1983 | Nakayama et al. | 307/572 |
| 4,641,048 | 2/1987 | Pollock | 307/608 |
| 5,012,142 | 4/1991 | Sonntag | 307/602 |
| 5,039,893 | 8/1991 | Tomisawa | 307/597 |
| 5,051,625 | 9/1991 | Ikeda et al. | 307/542 |
| 5,054,038 | 10/1991 | Hedberg | 307/595 |
| 5,075,569 | 12/1991 | Branson | 307/603 |
| 5,192,886 | 3/1993 | Wetlaufer | 307/595 |
| 5,245,231 | 9/1993 | Kocis et al. | 307/602 |

FOREIGN PATENT DOCUMENTS

| | | |
|---|---|---|
| 0456231 | 11/1391 | European Pat. Off. |
| 0253914 | 1/1988 | European Pat. Off. |
| 0306662 | 3/1989 | European Pat. Off. |
| 0317759 | 5/1989 | European Pat. Off. |
| 0347983 | 12/1989 | European Pat. Off. |

*Primary Examiner*—Timothy P. Callahan
*Assistant Examiner*—My. Trang Nu Ton
*Attorney, Agent, or Firm*—Scott W. McLellan

[57] ABSTRACT

A variable delay line having a string of "slow" logic inverters and an equal number of "fast" inverters with inputs connected to corresponding "slow" inverter inputs. Transmission gates, coupling the "fast" inverter outputs to corresponding "slow" inverter outputs, vary the amount of current from the "fast" inverters added to the output current of the corresponding "slow" inverters. Maximum delay occurs when substantially no current from the "fast" inverter is added to the "slow" inverter output current and minimum delay occurs when substantially all the current from the "fast" inverter is added to the "slow" inverter output current. The variable delay line may be configured into a variable frequency ring oscillator, useful in phase-locked-loops or the like.

10 Claims, 2 Drawing Sheets

WIDE-RANGE VARIABLE DELAY AND RING OSCILLATOR

This application is a continuation of application Ser. No. 08/023243, filed on Feb. 25, 1993, now abandoned.

BACKGROUND OF THE INVENTION

1. Field of the Invention

This invention relates to delay lines in general and, more particularly, logic gate based variable delay lines and variable frequency ring oscillators.

2. Description of the Prior Art

Delay lines are widely used in a variety of integrated circuit applications, such as delay-locked-loops and clock generators. The delay line is typically formed on an integrated circuit by cascading a string of logic inverters, each connection between the inverters serving as a "tap" along the delay line. The total delay through the delay line is approximately equal to the sum of the individual inverter propagation delays. One method of controlling the amount of delay through the line is by varying ("starving") the power supply current supplied to the inverters. Another way is by varying the amount of capacitance loading on the output of the inverters as shown in U.S. Pat. No. 5,012,142, assigned to the same assignee as this invention and incorporated herein by reference.

A drawback to the above delay control approaches is the possible inability of the delay line delay to be as short as the technology used to implement the delay line allows. For example, the minimum delay for a current "starved" inverter based delay line may be significantly longer than if the inverters were not current limited. Further, at maximum delay, the signals propagating through the inverters may be so slow in rise and fall times that instabilities in circuits coupled to the delay line may occur.

Connecting the input of an active delay line to its output forms a ring oscillator which are widely used in, for example, integrated circuit phase locked loops. The oscillators generally have an odd number of inverting delay stages (typically logic inverters) serially connected into a ring with the oscillation frequency being substantially determined by the inverter propagation of delays. The amount of delay by each inverter is controlled as discussed above. In correspondence with the variable delay line problems mentioned above, while the ring oscillator does allow for wide variations in oscillation frequency, the highest oscillation frequency may be considerably less than the maximum possible for the logic technology used to implement the oscillator. Further, the lowest frequency of oscillation may not have sufficient amplitude for circuits utilizing the output of the oscillator and the oscillator may completely stop oscillation due to the gain of the inverters being insufficient to support oscillation. Still further, the relationship between the control signal and the oscillation frequency may be very non-linear.

Thus, it is desirable to provide a variable delay line design having wide delay range without having too slow logic rise and fall times at the longest desired delays and having shorter minimum delays than prior art designs. Further, it is desirable to provide a ring oscillator design that has wide frequency variation range, a higher maximum oscillation frequency than prior art designs, and consistent, full amplitude, reliable oscillation at the lowest desired frequency of oscillation. In addition, it is desirable to provide an oscillator with an approximately linear control signal to oscillator frequency relationship.

SUMMARY OF THE INVENTION

A variable delay line having an input, an output and at least one first logic gate having an input coupling to the input of the delay line and an output, having a capacitive load, coupling to the output of the delay line. The invention is characterized by at least one second logic gate, having an input coupling to the input of the first logic gate and providing a second current to an output, and a variable current limiter disposed between the first logic gate output and the second gate output. The variable current limiter is responsive to a control signal to vary the amount of second current added to the first current which, when combined with the capacitive load, substantially determines the amount of delay through the delay line.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
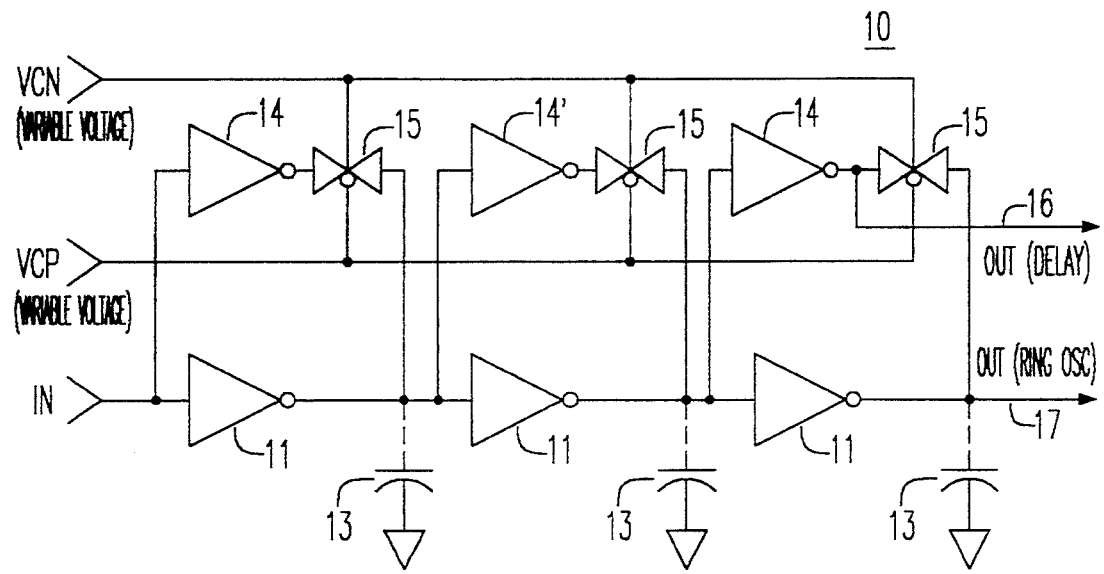
FIG. 1 is a simplified schematic diagram of an exemplary embodiment of the invention as a voltage controlled variable delay line.

Referring to FIG. 1, an exemplary embodiment of the invention as a variable delay line 10 is shown as a three stage (logic gate) delay line having a string of relatively long propagation delay ("slow") logic gates 11 providing a first output current and paralleled corresponding relatively short propagation delay ("fast") logic gates 14 providing a second output current. Transmission gates 15, responsive to control signals VCN, VCP, vary the amount of current from the outputs of "fast" logic gates 14 to the outputs of corresponding "slow" logic gates 11. The variable current added to the output current from the "slow" gates 11, when combined with the representative capacitive loading 13 on the outputs of gates 11, substantially determines the delay through the delay line 10.

Two outputs are provided, OUT(DELAY) 16 and OUT(RING OSC.) 17. The output 16 has the fastest rise and fall times because it is being driven by a fast inverter 14. Since it is desirable to have subsequent logic circuitry (not shown) driven by logic signals having the fastest rise and fall times, the output 16 is used for driving additional logic. However, because the output 17 has relatively longer rise and fall times than the output 16 particularly at longer delays through delay line 10, this output is useful in ring oscillator applications, as will be discussed below.

Figure 2:
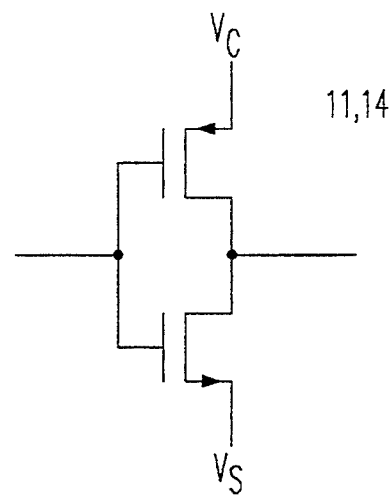
FIG. 2 is a simplified schematic diagram of an exemplary logic inverter.

As described below, the propagation delay of the delay line 10 is substantially determined by the ability of a gate 11, 14 to charge the input capacitance, and other distributed capacitance of the subsequent gates 11, 14. The less the current, the lower the delay. For purposes here, the total capacitance affecting a gate combination 11, 14 is illustrated here as the representative capacitive load 13 on the output of a gate 11. Here, the logic gates 11, 14 are shown as common CMOS inverters, such as that shown in FIG. 2. The "slow" inverters 11 have the transistors therein sized to provide relatively low output current, thus determining the longest propagation the delay in the delay line 10 (FIG. 1). In contrast, the "fast" inverters 14 are designed to have the transistors therein sized to provide a large amount of current and are typically sized to have the shortest propagation delay for the technology used. For example, for the "slow" inverters 11, the N-channel and P-channel transistors are made with an exemplary length-to-width ratios of 10:1 and 20:1, respectively, the delay of the inverter 11 is approximately 10 ns when the output thereof is loaded with and exemplary load capacitance of approximately 0.1 pF, representative of the minimum loading of a typical inverter 11 as shown in FIG. 1. For the "fast" inverter 14, the exemplary length-to-width ratios of the N-channel and P-channel transistors are 3:10 and 6:10, respectively, resulting an exemplary propagation delay of approximately 1 ns when the inverter is loaded with an exemplary capacitive load of approximately 0.25 pF, representative of the maximum loading of an exemplary inverter 14 in FIG. 1.

Figure 3:
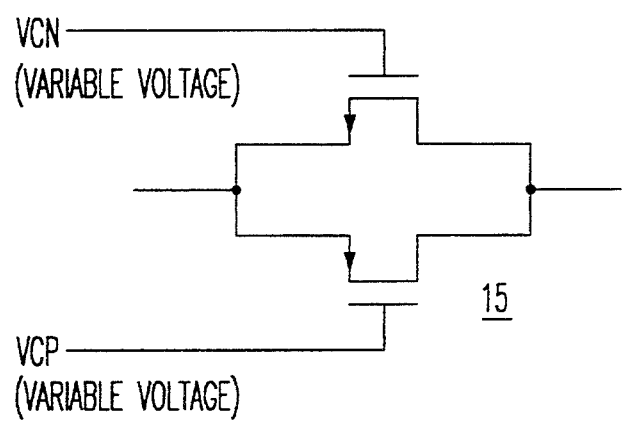
FIG. 3 is a simplified schematic diagram of a transmission gate used in the exemplary embodiment of FIG. 1.

As shown in FIG. 3, the transmission gates 15 are of a conventional design having an N-channel MOSFET transistor and a P-channel MOSFET transistor with common drains and sources. The gates thereof couple to the respective control signals VCN, VCP which control the conductivity of the corresponding transistors in the transmission gate 15 and, consequently, the total delay of the delay line 10 (FIG. 1) by limiting the amount of current from an exemplary gate 14 to the representative capacitive load 13. In essence, the amount of "help" in the form of current the fast gate can provide to the slow gate 11 is substantially determined by the conductivity of the gate 15. Thus, the minimum delay occurs when gate 15 is fully conductive (gate 14 is fully in parallel with gate 11) and the maximum delay occurs when gate 15 is minimally conductive (gate 11 essentially acts alone), as illustrated in FIG. 4.

Figure 4:
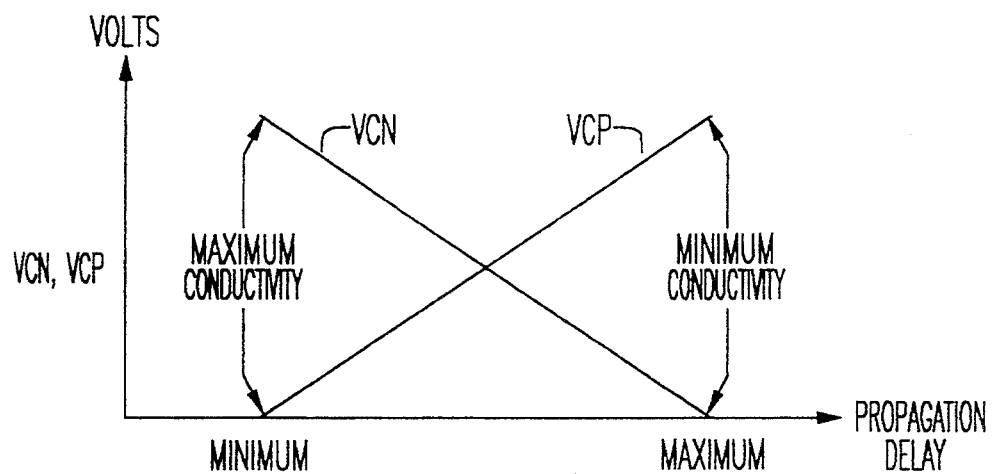
FIG. 4 is an exemplary plot showing the relationship between a control voltage and propagation delay of the delay line in FIG. 1.

An exemplary relationship between the control signals VCN and VCP is shown in FIG. 4. For purposes here, the signals VCN and VCP are complementary: as the voltage VCN increases, the voltage VCP decreases. Thus, the conductivity of both the N-channel and P-channel transistors in the gate 15 (FIG. 3) change concurrently. Further, it is preferable that the conductivity of the N-channel transistor and the P-channel transistor be substantially the same. As shown, as the control signals change to increase the conductivity of the gate 15, the delay of the delay line 10 (FIG. 1) decreases because the gate 15 limits the amount of current flowing from gate 14 (FIG. 1). If no current is passed by gate 15 (transistors therein are at minimum conductivity) the maximum delay occurs as shown in FIG. 4. Alternatively, if substantially all the current from gate 14 passes through gate 15 (transistors therein are fully conductive), then the minimum delay occurs.

Figure 5:
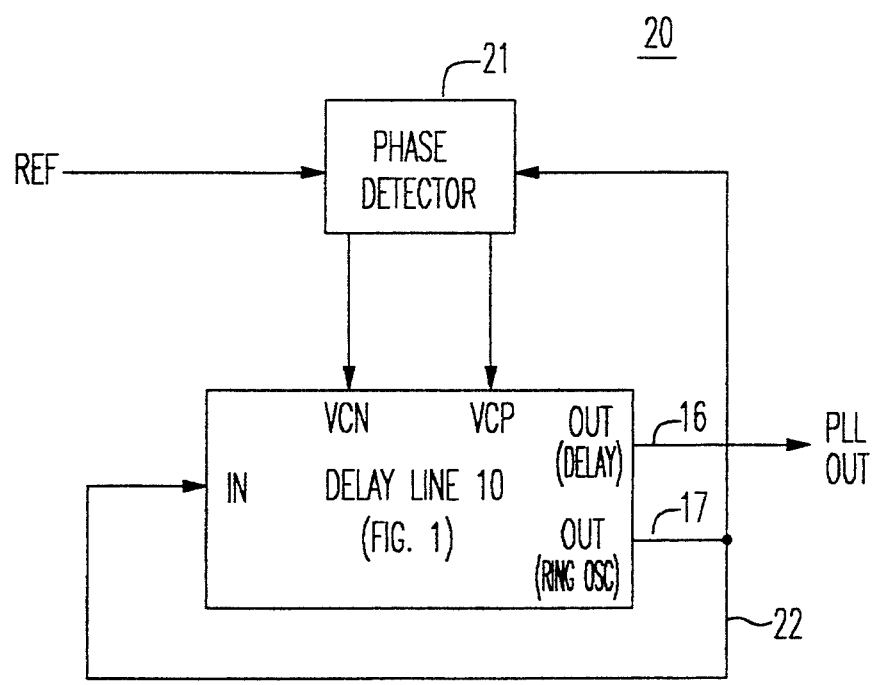
FIG. 5 is a simplified schematic diagram of an exemplary embodiment of the invention as a voltage controlled ring oscillator in a phase-locked-loop.

By taking the delay line 10 (FIG. 1) and coupling the input to the output 7 thereof, a variable frequency ring oscillator 22 is formed as shown in FIG. 5. Output of the ring oscillator 22 is taken from the output 16. The oscillation frequency of the ring oscillator 22 is substantially determined by the delay through the delay line 10. Advantageously, because the minimum frequency of the ring oscillator is substantially determined by the maximum delay through the delay line 10, reliable oscillation of the ring oscillator occurs at the minimum frequency. Further, the maximum frequency of oscillation occurs when the delay line 10 is at minimum delay.

By adding a conventional phase detector 21 (e.g., a charge pump phase detector with complementary outputs) to compare the output frequency of the ring oscillator 22 to a reference signal and to control the frequency of the ring oscillator 22, a phase-locked-loop 20 is formed.

EXEMPLARY RESULTS

A ring oscillator 22 has been formed on an integrated circuit using the circuit substantially as shown in FIG. 1 as the variable delay line 10. Using the exemplary transistor sizes discussed above in a 0.9 $\mu$m CMOS process, the ring oscillator 22 has an approximate frequency range of 10 to 100 MHz.

It is understood that other circuit topologies and technologies instead of CMOS may be used to implement the delay line 10. The number of inverter stages in the delay line may be increased or decreased as needed. It is understood that an odd number (three or more) inverter stages are needed for the ring oscillator 22 as shown in FIG. 5. Further, the logic gates 11, 14 may be more complex logic functions such as NAND or NOR gates. Still further, all the logic gates need not be inverting.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. A variable delay line having an input, an output, and at least one first logic gate having an input coupling to the input of the delay line and providing a first current at an output, having a capacitive lead, coupling to the output of the delay line, CHARACTERIZED BY:
    at least one second logic gate having an input coupling to the input of the first logic gate and providing a second current to an output; and
    a variable current limiter disposed between the first logic gate output and the second logic gate output; wherein the variable current limiter, in response to an analog control signal, varies the amount of second current added to the first current which, when combined with the capacitive lead, substantially determines the amount of delay through the delay line.

2. The variable delay line as recited in claim 1, wherein the current limiter is a transmission gate.

3. The variable delay line as recited in claim 2, wherein the logic gates are inverters.

4. The variable delay line as recited in claim 2, wherein the logic gates are CMOS inverters and the transmission gates are complementary MOSFETs with common sources and drains.

5. A variable delay line having and an input, an output and a string of first logic gates connected between the input and the output of the delay line, each of the first logic gates having an input and providing a first current to an output having a capacitive lead, CHARACTERIZED BY:

a plurality of second logic gates, each gate having an input and providing to an output a second current, the input coupling to a corresponding input of a first logic gate, and a plurality of variable current limiters, each disposed between the outputs of corresponding first and second logic gates;

wherein the variable current limiters, in response to an analog control signal, varies the amount of second current added to the first current which, when combined with the capacitive load, substantially determines the amount of delay through the delay line.

6. The variable delay line as recited in claim 5, wherein each of the plurality of current limiters is a transmission gate.

7. The variable delay line as recited in claim 6, wherein the logic gates are inverters.

8. The variable delay line as recited in claim 6, wherein the logic gates are CMOS inverters and the transmission gates are complementary MOSFETs with common sources and drains.

9. The variable delay line as recited in claim 7, wherein the input of the delay line is coupled to the output thereof to form a ring oscillator.

10. The variable delay line as recited in claim 9, further characterized by a phase detector, coupling to the output of the delay line and responsive to a reference signal, for generating the control signal.

* * * * *